United States Patent
Bloom et al.

[19]

[11] Patent Number: 6,005,777

[45] Date of Patent: Dec. 21, 1999

[54] BALL GRID ARRAY CAPACITOR

[75] Inventors: Terry R. Bloom, Middlebury; Richard O. Cooper, Bluffton; Robert L. Reinhard, Berne, all of Ind.

[73] Assignee: CTS Corporation, Elkhart, Ind.

[21] Appl. No.: 09/189,592

[22] Filed: Nov. 10, 1998

[51] Int. Cl.⁶ .................................................. H05K 1/16
[52] U.S. Cl. ...................... 361/766; 361/773; 361/763; 361/760; 174/252; 174/260; 174/261; 257/698; 257/778; 257/691; 257/532
[58] Field of Search .................................. 361/766, 712, 361/773, 763, 760; 174/260, 261, 252; 257/698, 778, 691, 693, 532

[56] References Cited

U.S. PATENT DOCUMENTS

| | | | |
|---|---|---|---|
| 4,300,115 | 11/1981 | Ansell et al. | 338/314 |
| 4,332,341 | 6/1982 | Minetti | 228/180 |
| 4,654,628 | 3/1987 | Takayanagi | 338/320 |
| 4,658,234 | 4/1987 | Takayanagi | 338/260 |
| 4,945,399 | 7/1990 | Brown et al. | 357/74 |
| 5,216,404 | 6/1993 | Nagai et al. | 338/22 |
| 5,379,190 | 1/1995 | Hanamura et al. | 361/766 |
| 5,539,186 | 7/1996 | Abrami et al. | 219/548 |
| 5,557,502 | 9/1996 | Banerjee et al. | 361/712 |
| 5,621,619 | 4/1997 | Seffernick et al. | 361/773 |
| 5,635,767 | 6/1997 | Wenzel et al. | 257/778 |
| 5,636,099 | 6/1997 | Sugawara et al. | 361/278 |
| 5,661,450 | 8/1997 | Davidson | 338/320 |
| 5,726,485 | 3/1998 | Grass | 257/532 |
| 5,745,334 | 4/1998 | Hoffarth et al. | 361/313 |
| 5,796,587 | 8/1998 | Lauffer et al. | 361/763 |
| 5,870,274 | 2/1999 | Lucas | 361/311 |
| 5,903,050 | 5/1999 | Thurairajaratnam et al. | 257/695 |

*Primary Examiner*—Leo P. Picard
*Assistant Examiner*—David Foster
*Attorney, Agent, or Firm*—Mark P. Bougeois

[57] ABSTRACT

A ball grid array capacitor has a substrate with a top and bottom surface and a via extending through the substrate. Several capacitors are located on the bottom surface. The capacitors include a top electrode connected to the via, a dielectric layer connected to the top electrode, and a bottom electrode that is connected to the dielectric layer and a ball pad over the bottom electrode. A passivation layer is located between the capacitors. Several solder spheres are electrically and mechanically connected to the bottom electrode. A resistor can be mounted on the top surface and connected to the via to form a filter.

9 Claims, 2 Drawing Sheets

BALL GRID ARRAY CAPACITOR

BACKGROUND OF THE PREFERRED EMBODIMENT(S)

1. Field of the Preferred Embodiment(s)

This invention generally relates to electrical component networks for electronics. Specifically, the invention is capacitors or capacitors and resistors. Typically, these networks are mounted in a high density network or array package under spherical solder connections.

2. Description of the Related Art

Resistor and capacitor networks are commonly used in filters and in high speed digital signal line terminations to minimize unwanted reflections back through the transmission structure which is typically a printed circuit board. In most applications, the terminations are made by placing a capacitor and resistor with an impedance matching the impedance of the transmission line, at the end of the transmission line. One end of the capacitor and resistor combination is connected to a common termination voltage, and the other end is connected to the signal line. For these applications, a bussed network is a convenient solution, since one end of the termination is common to all signal lines. The previous capacitor network designs include surface mount, and through hole SIP and DIP versions.

Despite the advantages of each type of prior art capacitor network, none have been easily or economically manufactured with a high density of interconnects per unit area on a printed circuit board. In particular, providing the electrical connections only on the periphery of the network causes the electrical leads to be tightly spaced on the edge of the device, while the area in the interior of the device is unused for electrical interconnections. Therefore, there is a current unmet and heretofore long felt need for a capacitor network and a combination capacitor/resistor network with higher density and improved signal integrity.

DESCRIPTION OF RELATED ART

Examples of patents related to the present invention are as follows, and each patent is herein incorporated by reference for the supporting teachings:

U.S. Pat. No. 4,945,399, is an electronic package with integrated distributed decoupling capacitors.

U.S. Pat. No. 5,557,502, is a ball grid array package.

U.S. Pat. No. 4,300,115, is a multi-layer via resistor.

U.S. Pat. No. 4,658,234, is a resistor network.

U.S. Pat. No. 5,621,619, is an all ceramic surface mount sip and dip network having spacers and solder barriers.

U.S. Pat. No. 5,379,190, is a chip type composite electronic part and manufacturing method.

U.S. Pat. No. 4,332,341, is a fabrication of circuit packages using solid phase solder bonding.

U.S. Pat. No. 5,539,186, is a temperature controlled multi-layer module.

U.S. Pat. No. 5,216,404, is a SIC thin film thermistor.

U.S. Pat. No. 4,654,628, is a network resistor unit.

U.S. Pat. No. 5,661,450, is a low inductance termination resistor array.

The foregoing patents reflect the state of the art of which the applicant is aware and are tendered with the view toward discharging applicant's acknowledged duty of candor in disclosing information that may be pertinent in the examination of this application. It is respectfully stipulated, however, that none of these patents teach or render obvious, singly or when considered in combination, applicant's claimed invention.

SUMMARY OF THE PREFERRED EMBODIMENT(S)

It is a feature of the invention to provide a ball grid array capacitor network. Specifically, there is a substrate, capacitors, and vias arranged in a configuration. Solder spheres are used to connect the capacitors to other electronic circuitry such as a printed circuit board.

It is also a feature of the invention to provide a ball grid array capacitor network including a substrate having a top and bottom surface and a via extending through the substrate between the top and bottom surfaces. Several capacitors are located on the bottom surface. The capacitors include a top electrode connected to the via, a dielectric layer connected to the top electrode, and a bottom electrode that is connected to the dielectric layer. Several solder spheres are electrically and mechanically connected to the bottom electrode.

An additional feature of the invention to provide a ball pad that is disposed between the solder sphere and the bottom electrode.

A further feature of the invention to provide a passivation layer that is disposed between the capacitors.

Another feature of the invention to provide a resistor that is mounted on the first surface and electrically connected to the via.

It is a feature of the invention to provide an encapsulating cover coat over the resistor.

An additional feature of the invention to provide a resistor and capacitor filter network.

Still another feature of the invention is to provide a method of manufacturing a ball grid array capacitor network.

The invention resides not in any one of these features per se, but rather in the particular combination of all of them herein disclosed and claimed and it is distinguished from the prior art in this combination of all of its structures for the functions specified.

There has thus been outlined, rather broadly, the more important features of the invention so that the detailed description thereof that follows may be better understood, and so that the present contribution to the art may be better appreciated. There are, of course, additional features of the invention that will be described hereinafter and which will form the subject matter of the appended claims. Those skilled in the art will appreciate that the preferred embodiment may readily be used as a basis for the designing of other structures, methods and systems for carrying out the several purposes of the present invention. It is important, therefore, that the claims are regarded as including such equivalent constructions since they do not depart from the spirit and scope of the present invention.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings. The description of the invention may contain, for example, such descriptive terms as up, down, top, bottom, right or left. These terms are meant to provide a general orientation of the parts of the invention and are not meant to be limiting as to the scope of the invention.

DETAILED DESCRIPTION OF THE PREFERRED EMBODIMENT

Figure 1:
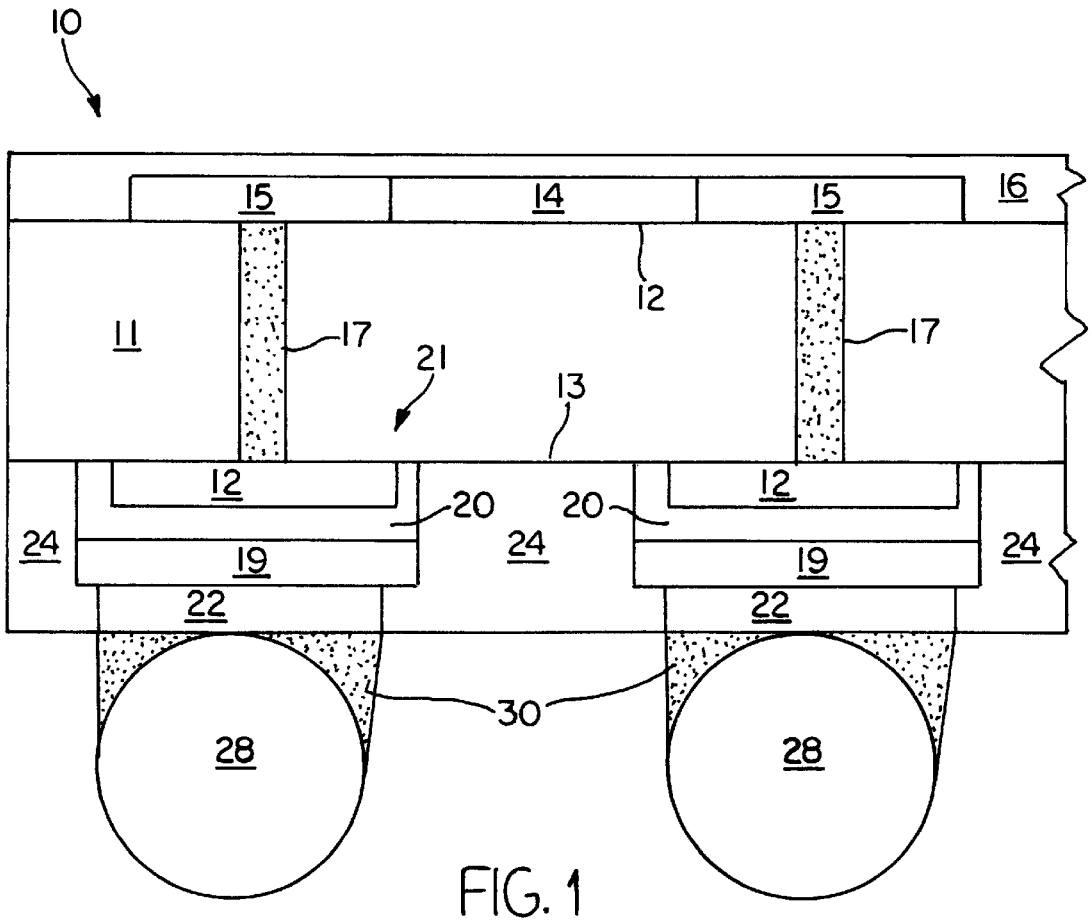
FIG. 1 is a side cross-sectional view of a portion of a capacitor network.
Figure 2:
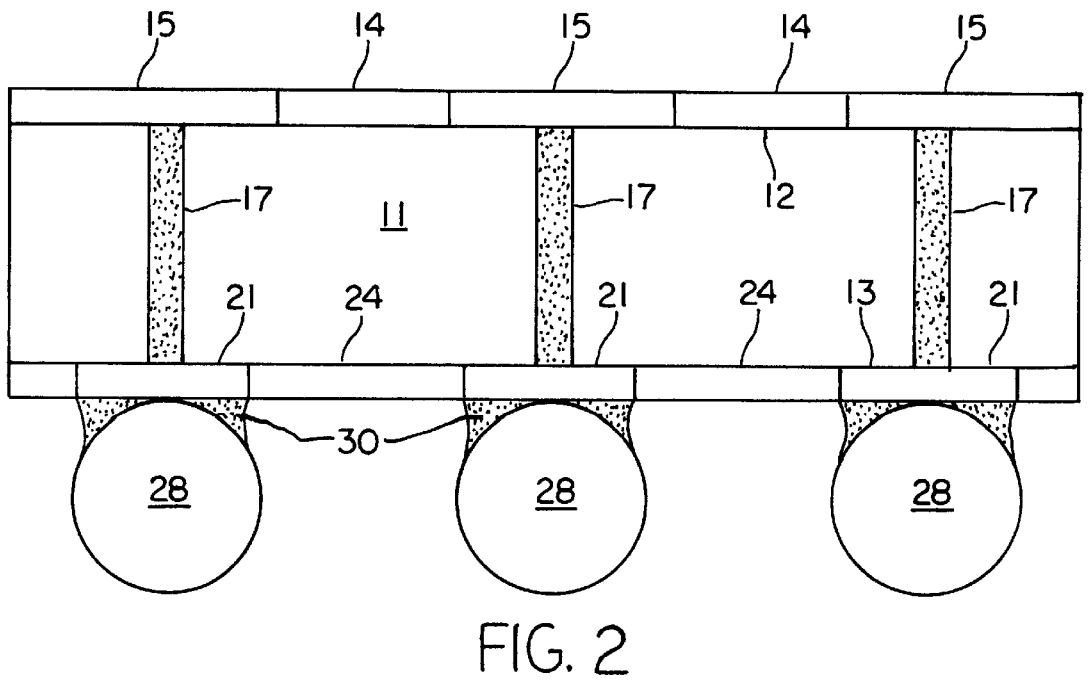
FIG. 2 is an side view of the overall capacitor network of FIG. 1.

Referring to FIGS. 1 and 2, there is a ball grid array capacitor network assembly 10. In particular, resistor network assembly 10 has a planar substrate 11 having a top surface 12 and a bottom surface 13. Substrate 11 is preferably made out of a ceramic material such as alumina oxide. Resistors 14 are disposed and trimmed on top surface 12 by conventional thick film resistor processing techniques. Resistors 14 are electrically connected to conductors 15. Conductors 15 are also disposed on top surface 12 by conventional thick film conductor processing techniques. Conductors 15 and resistors 14 slightly overlap and sinter to form a mechanical and electrical bond during processing. An overcoat 16 can optionally be applied over the resistors to act as a protective barrier.

Ceramic substrate 11 has cylindrical vias 17 formed therein and which extend through substrate 11 and are formed with a conductive via fill material. Via 17 is made using conventional thick film conductor techniques that is screened and fired. Via 17 electrically connects conductors 15 to electrodes 18. Electrode or plate 18 is located on bottom surface 13. A dielectric 20 is located over and surrounding electrode 18. Dielectric 20 is formed from a material with a dieletric constant which ranges from 10 to 20,000 such as barium titanate. A second electrode or plate 19 is deposited over dielectric 20. A ball pad 22 is deposited over second electrode 19. First electrode 18, dielectric 20, and second electrode 19 form a capacitor 21. Capacitor 21 can have capacitance values ranging from 10 picofarads to 15,000 picofarads. A passivation layer 24 is deposited on bottom side 13 extended fully between capacitors 21. Electrodes 18 and 19, dielectric 20, ball pads 22 and passivation layer 24 are fabricated from commercially available thick film materials and are deposited using conventional thick film screening and firing techniques.

Solder spheres 28 are mechanically and electrically attached to ball pads 22. Solder spheres may be 10% tin and 90% lead and are commercially available from Alpha Metals Corporation. The solder spheres can be other alloys such as 5–20% tin and 80–95% lead. Solder spheres 28 are attached to ball pads 22 using a solder 30 which is screened on in paste form and reflowed. The solder paste would typically be 63% tin and 37% lead. Solder sphere 28 typically connects to an external electrical circuit such as on a printed circuit board (not shown).

Capacitor network assembly 10 is assembled by the following process sequence:

a) Providing a ceramic substrate 11 with apertures 17;

b) Filling aperture 17 by screening a conductive material such as a silver palladium paste commercially available from Dupont Corporation, Wilmington, Del.;

c) Firing vias 17 in a reflow oven at between 700 to 900 degrees Celsius;

c) Screen depositing a top electrode 18 using an electrode material from Dupont, electrode 18 is connected to via 17 on bottom substrate surface 13;

d) Firing the top electrode 18 in a reflow oven at between 700 to 900 degrees Celsius;

e) Screen depositing a dielectric 20 onto and surrounding top electrode 18, various dielectric materials are commercially available from Dupont Corporation;

f) Firing dielectric 20 at between 700 to 900 degrees Celsius;

g) Screen depositing a passivation layer 24 adjacent dielectric 20, various passivation materials are commercially available form Dupont;

h) Firing passivation layer 24 at between 700 to 900 degrees Celsius;

i) Screen depositing a bottom electrode 19 onto dielectric 20;

j) Firing bottom electrode 20 at between 700 to 900 degrees Celsius;

k) Depositing a ball pad 22 over bottom electrode 19, the ball pad material is commercially available from Dupont Corporation;

l) Firing ball pad 22 at between 700 to 900 degrees Celsius;

m) Screen depositing another or second passivation layer 24 adjacent bottom electrode 19 and ball pad 22;

n) Firing passivation layer 24 at between 700 to 900 degrees Celsius;

o) Screen depositing a conductor 15, connected to via 17, on top substrate surface 12, the conductor material is a silver palladium past commercially available form Dupont;

p) Firing conductor 15 at between 700 to 900 degrees centigrade;

q) Screen depositing a resistor 14, connected to conductor 15, the resistor material is commercially available from Dupont;

r) Firing resistor 14 at between 700 to 900 degrees centigrade;

s) Trimming the resistance value of resistor 14 using a laser, for example;

t) Screen depositing a cover coat 16 over resistor 14, conductor 15 and top substrate surface 12;

u) Curing cover coat 16;

v) Screening a solder paste 30 onto ball pad 22;

w) Placing a solder sphere 28 onto solder paste 30; and x) Reflowing solder paste 30 in an oven such that a mechanical and electrical connection is made between ball pad 22 and solder sphere 28;

y) Testing assembly 10 using standard electrical tests such as measuring capacitance and resistance.

Figure 3:
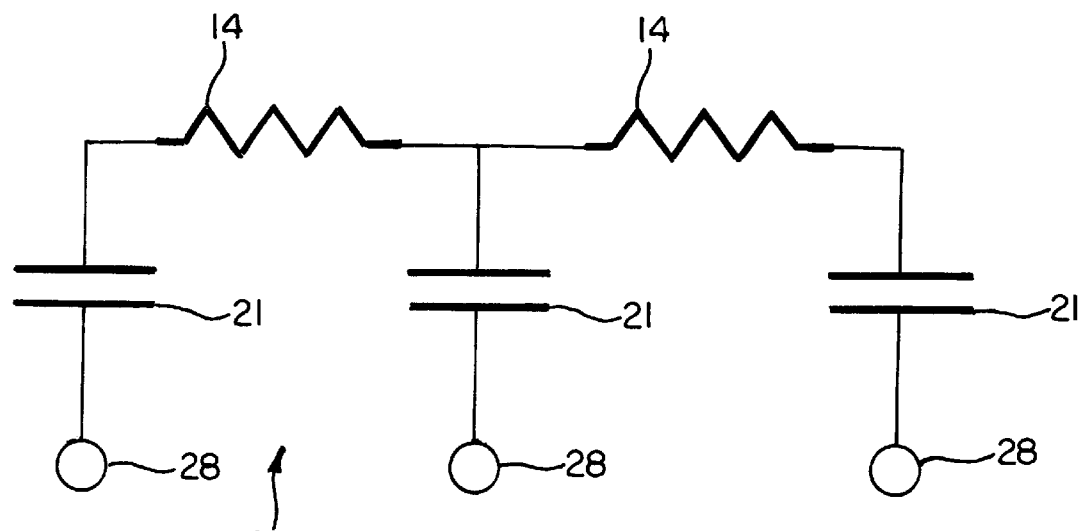
FIG. 3 is an electrical schematic of the network of FIG. 1.

Referring to FIGS. 2 and 3, a side view of the ball grid array capacitor network and an electrical schematic are shown. Three solder spheres 28 are connected to three capacitors 21 that are connected to resistors 14. The center sphere 28 is typically common by a connection to ground. Thus, each group of three capacitors 21 and two resistors 14 form two Capacitor-Resistor-Capacitor combinations or filters 32.

Figure 4:
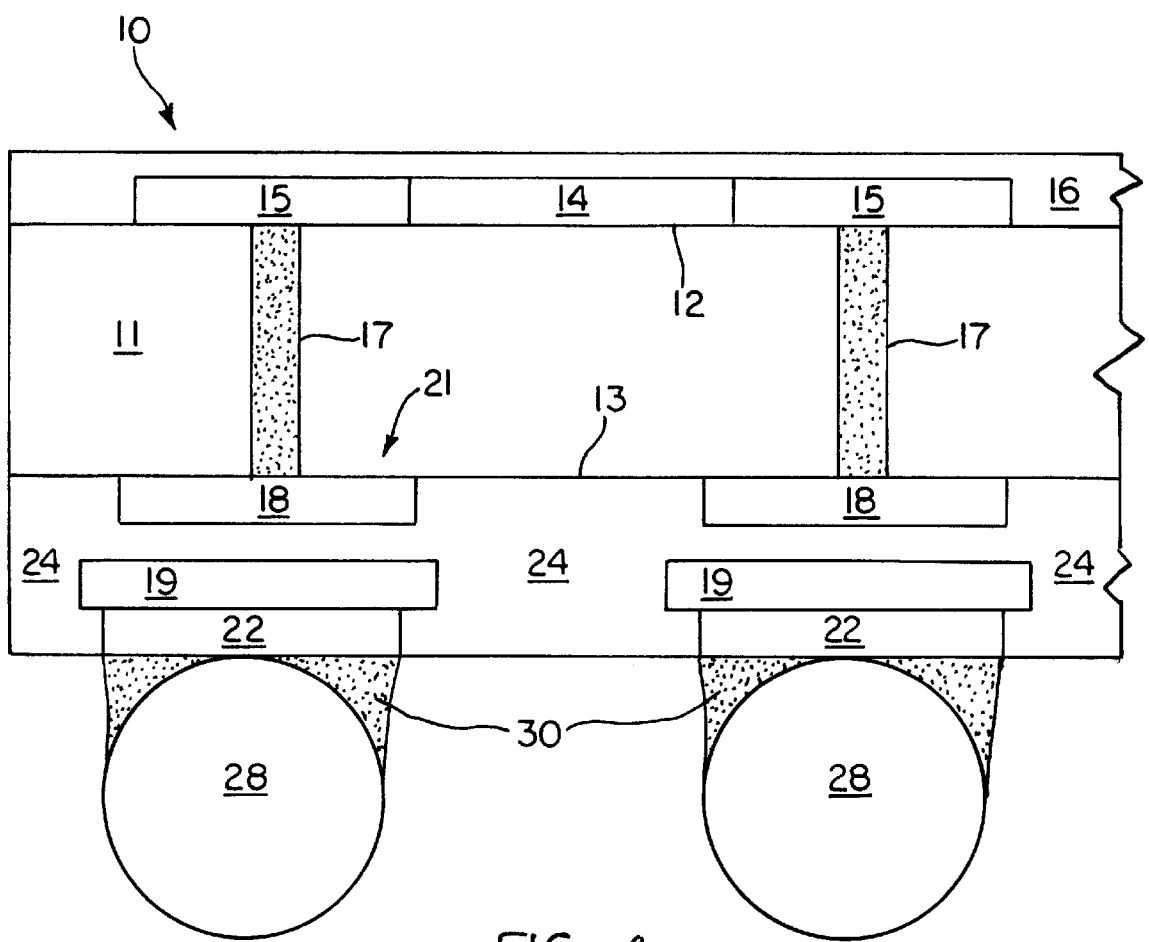
FIG. 4 is an alternative embodiment of a capacitor network.

Referring to FIG. 4, an alternative embodiment of the ball grid array capacitor network is shown. FIG. 4 is identical to FIG. 1, except that dielectric material 20 has been eliminated and the passivation layer 24 has been deposited between electrodes 18 and 19. The passivation material has a lower dielectric constant than the dielectric material and as a result capacitors made with this embodiment are limited in the capacitance values that they can achieve. The embodiment of FIG. 4 does however result in simplified processing due to the elimination of the steps (e) and (f) in the process sequence of applying and firing the dielectric layer 20.

VARIATIONS OF THE PREFERRED EMBODIMENT(S)

One of ordinary skill in the art of making thick film capacitors and resistors, will realize that there are many different ways of accomplishing the preferred embodiment. For example, although it is contemplated to make substrate 11 out of a fired alumina ceramic, other suitable materials would work, such as a low temperature co-fired ceramic. Additionally, although a network of three capacitors 21 and two resistors 14 was shown, more or fewer resistors and capacitors could be placed and connected to form different filter or terminator networks. It is contemplated to have any combination of n capacitors and m resistors connected in series or parallel. Additionally, more or fewer rows of solder spheres could be used.

It is further possible to have other electrical connections through the substrate other than conductor filled vias. It is possible to use staked copper or metal pins in place of the vias 17. The specification has shown the resistors 14 with a cover coat 16. It is contemplated, however, to omit the cover coat.

Another variation of the preferred embodiment is to use other types of solder preforms in place of solder spheres 28. For example, solder donuts, wires or squares could be used. Further, the solder could be made from materials other than tin lead. For example, a mixture of tin/indium or tin/bismuth could be used if a lower melting solder is desired. A mixture of tin/silver or tin/antimony could be used if a higher temperature solder is desired.

While, the capacitors 21 have been shown on the bottom and resistors 14 on the top, it is considered equivalent to have combinations where the capacitors on the top or side and the resistors are on the bottom or side. The specification has shown the use of a ball pad 22, over an electrode 19. It is contemplated that ball pad 22 could be omitted.

Additionally, the passivation layer 24 could be used in place of dielectric 20 as a dielectric material for capacitor 21.

Further, the steps of processing sequence could be modified from that shown in the specification to produce the same end result. For example, resistors 14 could be placed before capacitors 21 or the screening of some of the capacitors 21 could be omitted and solder spheres 28 reflow soldered directly to vias 17.

If desired, other electrical elements could be added to assembly 10 such as inductors or active electronic devices, for example.

Even though the embodiment showed a capacitor-resistor-capacitor filter, other types of filters are contemplated to be made such as a T-filter with a resistor-capacitor-resistor where the capacitor is commoned or a L-filter with a resistor capacitor where the capacitor is commoned.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A ball grid array capacitor network, comprising:
   a) a substrate having a first and a second surface, and a via extending through the substrate between the first and second surfaces;
   b) at least one capacitor, disposed on the second surface, including:
      b1) a first electrode connected to the via;
      b2) a passivation layer disposed over and in surrounding relationship to the first electrode; and
      b3) a second electrode connected to the passivation layer; and
   c) at least one solder sphere, electrically and mechanically connected to the second electrode.

2. The ball grid array capacitor network according to claim 1 wherein a ball pad is disposed between the solder sphere and the second electrode.

3. The ball grid array capacitor network according to claim 2, wherein a resistor is mounted on the first surface and electrically connected to the via.

4. A ball grid array capacitor network, comprising:
   a) a substrate having a first and a second surface, and at least two vias extending through the substrate between the first and second surfaces;
   b) at least two capacitors, disposed on the second surface, each capacitor including:
      b1) a first electrode connected to the via;
      b2) a dielectric layer surrounding the first electrode; and
      b3) a second electrode adjacent to the dielectric layer;
      b4) a bond pad connected to the second electrode;
   c) a passivation layer located between the capacitors; and
   d) at least two solder spheres, electrically and mechanically connected to the bond pads.

5. The ball grid array capacitor network according to claim 4, wherein a resistor is mounted on the first surface and electrically connected to the via.

6. The ball grid array capacitor network according to claim 5, wherein the resistor is encapsulated by a cover coat.

7. The ball grid array capacitor network according to claim 5, wherein a conductor is positioned on the first surface between the via and the resistor.

8. The ball grid array capacitor network according to claim 2, wherein the capacitors and resistor form a filter.

9. The ball grid array capacitor network according to claim 5, wherein the substrate is ceramic.

* * * * *